(12) United States Patent
Muramatsu et al.

(10) Patent No.: US 7,041,954 B2
(45) Date of Patent: May 9, 2006

(54) IMAGE READING APPARATUS

(75) Inventors: Shigeki Muramatsu, Shizuoka (JP); Tooru Uchida, Shizuoka (JP); Kouichi Furutou, Tokyo (JP); Kaname Nagatani, Tokyo (JP)

(73) Assignee: NEC Corporation, (JP)

( * ) Notice: Subject to any disclaimer, the term of this patent is extended or adjusted under 35 U.S.C. 154(b) by 393 days.

(21) Appl. No.: 10/444,401

(22) Filed: May 23, 2003

(65) Prior Publication Data
US 2003/0222202 A1 Dec. 4, 2003

(30) Foreign Application Priority Data
May 27, 2002 (JP) .............................. 2002-152195

(51) Int. Cl.
*G02B 26/08* (2006.01)

(52) U.S. Cl. .................................... 250/208.1; 358/474

(58) Field of Classification Search ............. 250/208.1; 358/474, 475, 505, 509
See application file for complete search history.

(56) References Cited

U.S. PATENT DOCUMENTS

| | | | | |
|---|---|---|---|---|
| 4,985,620 A * | 1/1991 | Takagi | ...................... | 250/208.1 |
| 5,606,450 A * | 2/1997 | Chen | .......................... | 359/223 |
| 5,995,243 A * | 11/1999 | Kerschner et al. | .......... | 358/461 |
| 6,222,647 B1 * | 4/2001 | Tadenuma et al. | .......... | 358/475 |
| 6,445,480 B1 * | 9/2002 | Huang et al. | ............... | 359/196 |
| 2002/0080421 A1 * | 6/2002 | Chiu | .......................... | 358/474 |
| 2003/0090748 A1 * | 5/2003 | Fang et al. | ................. | 358/505 |
| 2003/0210438 A1 * | 11/2003 | Huang et al. | ............... | 358/509 |

FOREIGN PATENT DOCUMENTS

| | | |
|---|---|---|
| JP | 63-182958 | 7/1988 |
| JP | 4-180338 | 6/1992 |
| JP | 08-237430 | 9/1996 |
| JP | 8-298570 | 11/1996 |
| JP | 10-271293 | 10/1998 |
| JP | 11-69042 | 3/1999 |
| JP | 2000-20704 | 1/2000 |
| JP | 2002-010002 | 10/2002 |

OTHER PUBLICATIONS

Japanese Office Action dated Nov. 17, 2004.
Office Action issued by Japanese Patent Office on Mar. 2, 2005 in connection with corresponding Japanese application No. 2002-182777.
English translation of relevant portions of Japanese Office Action dated Mar. 2, 2005.

* cited by examiner

*Primary Examiner*—Stephone B. Allen
(74) *Attorney, Agent, or Firm*—Ostrolenk, Faber, Gerb & Soffen, LLP

(57) ABSTRACT

A reduction optical system including a lens 12 and a mirror 13, a CCD image sensor 11 and a frame including a frame member 4 for accommodating the reduction optical system and the CCD image sensor are integrated to constitute an image reading unit 2, and the unit 2 is covered with a cover member 1. A lamp 3 is provided on the cover member 1 and spatially isolated from the inner space of the unit 2. A slit 16 of the cover member 1 is closed by a transparent member 10. The lamp 3 emits the light 15*a* onto a document 17 on a document setting glass 18, and the reflected light 15*b* from the document 17 enters the CCD image sensor 11 through the transparent member 10, slit 16, slit 4', mirror 13 and the lens 12 and is converted into electrical information, thereby reading image information of the document 17.

10 Claims, 8 Drawing Sheets

IMAGE READING APPARATUS

BACKGROUND OF THE INVENTION

1. Field of the Invention

The present invention relates to an image reading apparatus which reads an image of an object (which will be generically referred to as an "image" including a character, a figure, a pattern and others in this specification) in an image input portion of a copying machine, a facsimile, a scanner and others.

2. Description of the Related Art

Conventionally, a basic structure of an image reading apparatus which reads an image of an object in an image input portion of a copying machine, a facsimile, a scanner and others comprises a light source which irradiates the object such as an original document with the light, an optical system which leads the light which is emitted from the light source and reflected by the object, and an image sensor which receives the reflected light which is led by the optical system. A xenon lamp is often used as the light source, and a CCD image sensor in which CCD elements are one-dimensionally or linearly aligned are in heavy use as the image sensor. Usually, since a length of the CCD element row of the CCD image sensor is smaller than a reading width of the object, the reflected light of the object must be reduced in size by the optical system before being led to the CCD image sensor. For example, optical information corresponding to a reading width of 300 mm must be reduced in size so as to form an image on the CCD element row having a length of 70 mm. Therefore, there is used a reduction optical system which includes a lens which performs optical reduction and a mirror which reflects the reflected light so as to deflect a light path of the reflected light from a document surface (surface to be read) to the CCD image sensor.

In this image reading apparatus, when the reduction optical system, the CCD image sensor or the like is stained with dust or grime such as paper powder, quality of read-out image is disadvantageously degraded. Therefore, the reduction optical system or the CCD image sensor must be covered with a cover member and isolated from an external space. However, a slit through which the reflected light from the object, i.e. a light for reading, is transmitted must be provided to the cover member. For the stain prevention mentioned above, the slit must be narrowed to the necessary minimum level or covered with a transparent member such as a glass plate, thereby performing spatial shield.

However, when components with a large calorific value such as a lamp, a lamp lighting circuit (inverter circuit) and others as well as the reduction optical system and the CCD image sensor are arranged in a space substantially sealed by the cover member or the like, a temperature in the sealed space disadvantageously increases. Then, an increase in the temperature causes a reduction in performance or deterioration of each component such as the CCD image sensor or any other electrical components arranged in the sealed space, which can be a factor of degradation of the read-out image quality. That is, there is demanded a countermeasure for both the stain inside the unit and an increase in the temperature which can be factors of deterioration of the read-out image quality.

Further, the performance of the light source (e.g., a xenon lamp) is quickly degraded due to aging as compared with any other components. Therefore, in order to constantly obtain the excellent read-out image quality for a long time, the light source must be appropriately replaced at fixed intervals, and thus the light source has a property of consumable supplies in a kind. When the light source is arranged in a space substantially sealed by the cover member as described above, replacement of the light source which is one of periodical maintenance operations cannot be easily performed because it requires an additional operation such as removal of the cover member.

On the other hand, in the image reading apparatus, the relative positional relationship between the light source (lamp) or a reflecting plate and a reading position on the object has a great influence on the read-out image quality. Therefore, the relative positional relationship must be accurately maintained, and a reduction or irregularities in the positional accuracy due to an assembling error or aging must be suppressed. In particular, in case of the light source which must be periodically replaced, the positional accuracy must be maintained even after replacement. Furthermore, if the external light other than the reflected light from the document surface (surface to be read) enters from the slit provided to the cover member, there occurs a problem of degradation of the read-out image quality. In order to prevent this problem, narrowing the slit width to the necessary minimum level is effective. However, in order to constantly assuredly pass the reflected light on the surface to be read in such a case, the relative positional relationship between the slit, the light source and the reading position on the surface to be read must be accurately maintained.

SUMMARY OF THE INVENTION

It is, therefore, an object of the present invention to provide a image reading apparatus which can prevent deterioration in the read-out image quality due to the dust, grime or stain by covering the optical system and the image sensor with the cover member, prevent a reduction in performance of various components due to an increase in temperature in a space substantially sealed by the cover member, and has an excellent quality in the read-out image.

In order to attain the above object, according to the present invention, there is provided an image reading apparatus comprising: a light source emitting a light for irradiation of a surface of an object; an image reading unit containing an image sensor and an optical system which causes the light reflected by the surface of the object to enter the image sensor; a cover member covering the unit so as to allow the light reflected by the surface of the object to pass therethrough toward the optical system, wherein the light source is positioned so that the cover member spatially isolates the light source from an inner space of the image reading unit. The optical system may comprise a mirror and a lens. The light source may be attached to the cover member.

In this structure, since the unit comprising the image sensor and the optical system is covered with the cover member, the dust control effect can be obtained. Further, since the light source is spatially isolated from the inside of the unit, even if the light source generates the heat during lighting, that heat is blocked off by the cover member and it is not transmitted to the inside of the unit.

The cover member may have a slit through which the light reflected by the surface of the object is transmitted. The image reading apparatus may further comprise a transparent member attached to the cover member so as to seal the slit. The transparent member prevents the heat from being transmitted to the inside of the unit and the dust or grime from entering there.

The image reading apparatus may further comprise a lighting circuit for the light source attached to the cover member so that the cover member spatially isolates the lighting circuit from the inner space of the image reading unit. Then, like the light source, the heat of the lighting circuit is blocked off by the cover member and it is not transmitted to the inside of the unit.

The image reading apparatus may further comprise a reflecting plate attached to the cover member, which condenses the light emitted from the light source onto the surface of the object; and reflecting plate positioning means for defining a relative positional relationship between the cover member and the reflecting plate. According to this structure, the positional accuracy of the reflecting plate for improving the light utilization efficiency relative to the light source is enhanced, thereby avoiding degradation of the read-out image quality.

The image reading unit may have a frame for accommodating the image sensor and the optical system, and the cover member may be attached to the frame. The image reading apparatus may further comprise a holding member for the light source, which is attached to the frame and extending through the cover member to the outside of the cover member in which the light source is positioned; light source positioning means for defining a relative positional relationship between the light source and the frame; and cover member positioning means for defining a relative positional relationship between the cover member and the frame. With such a structure, it is possible to improve the relative positional relationship between the three components, i.e., the frame, the light source and the cover member.

The image reading apparatus may further comprise a reflecting plate attached to the holding member, which condenses the light emitted from the light source onto the surface of the object; and reflecting plate positioning means for defining a relative positional relationship between the holding member and the reflecting plate. In such a case, it is possible to improve the relative positional accuracy between the four components, i.e., the frame, the light source, the cover member and the reflecting plate.

DETAILED DESCRIPTION OF THE PREFERRED EMBODIMENTS

Preferred embodiments according to the present invention will now be described hereinafter with reference to the accompanying drawings.

Figure 1:
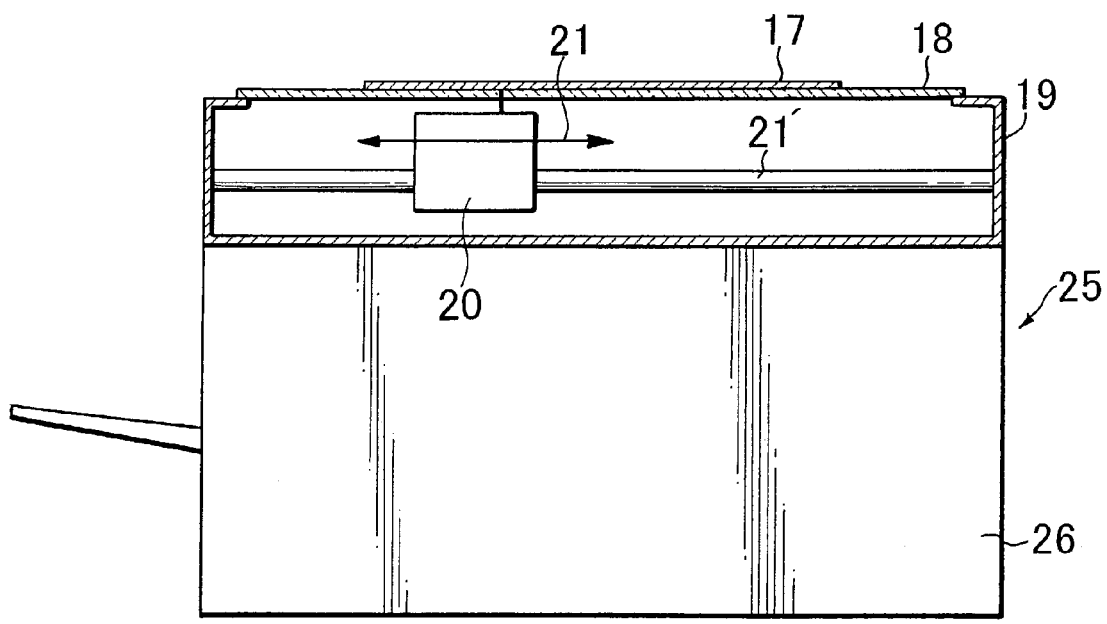
FIG. 1 is a schematic diagram showing an outline of a copying machine which is an example of an apparatus including an image reading apparatus according to the present invention.

FIG. 1 is a schematic view showing a copying machine which is an example of an apparatus including an image reading apparatus according to the present invention. The copying machine 25 has an image input portion 19 comprising a document setting glass plate 18 on which a document (object) 17 is placed and an image reading apparatus 20 which is arranged so as to be opposed to the document setting glass plate 18 and can move along a guide rod 21' extending in a scanning direction 21 which is in parallel to the document setting glass plate 18. The copying machine 25 has an image forming portion 26 which forms an image on a recording medium on the basis of a read-out image in the image input portion 19 by using a well-known process such as electrophotography, or the like. It is to be noted that an expression "image" is used as a generic term including a character, a figure, a pattern and others in this specification.

Figure 2:
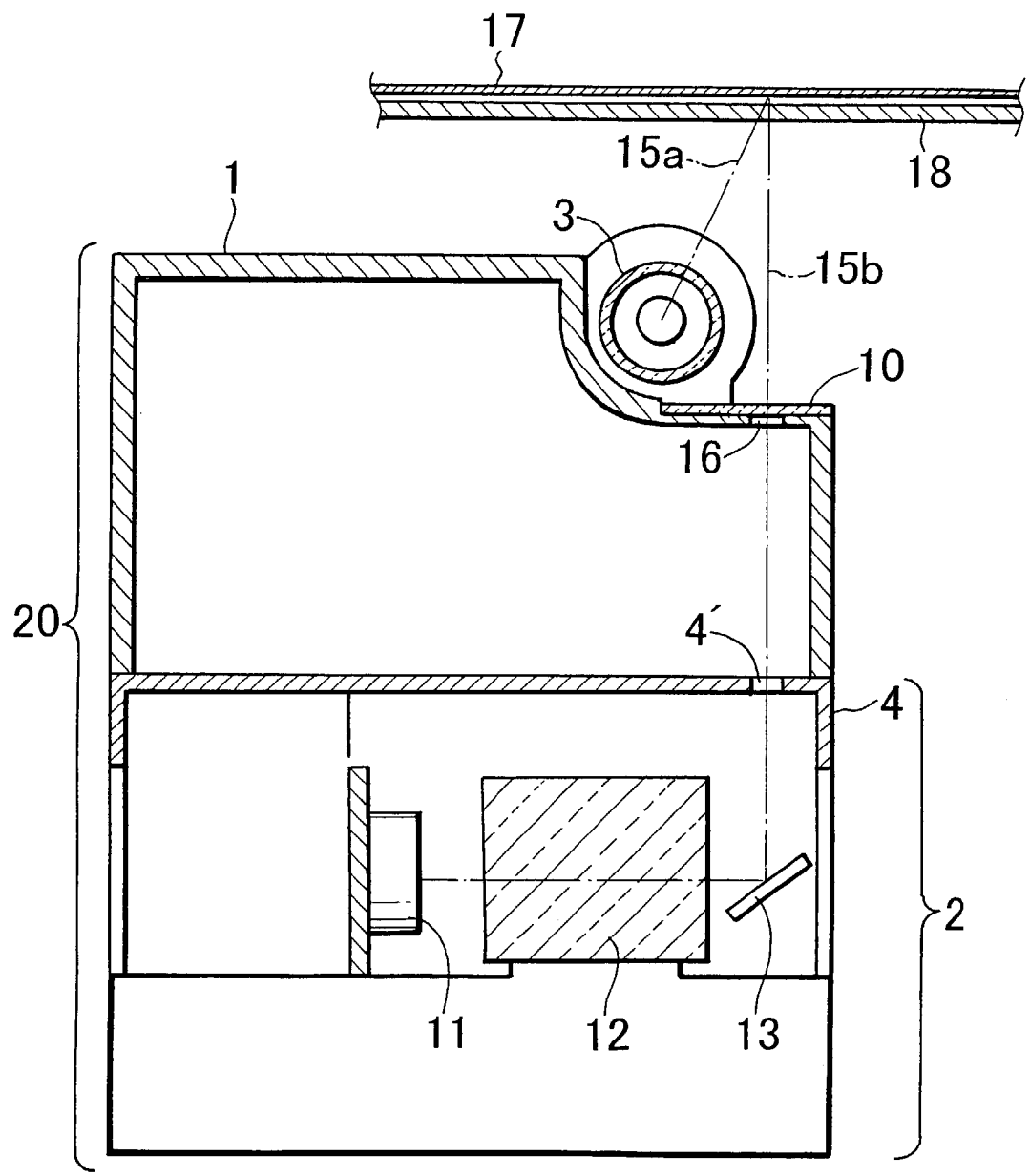
FIG. 2 is a cross-sectional view showing an outline of a structure of the image reading apparatus depicted in FIG. 1.

FIG. 2 is a schematic view showing a structure of the image reading apparatus 20 according to the embodiment depicted in FIG. 1. The image reading apparatus 20 has a reduction optical system including a lens 12 and a mirror 13, a CCD image sensor 11, a cover member 1, and a lamp (light source) 3 such as a xenon lamp. The lamp 3 and the CCD image sensor 11 extend in a direction perpendicular to the sheet of FIG. 2. The reduction optical system and the CCD image sensor 11 are held by and preferably shielded with a frame containing a frame member 4, and they are integrated so as to properly maintain their relative positional relationship and accommodated within the frame to form an image reading unit 2. Moreover, a cover member 1 is arranged above the unit 2, and the cover member 1 substantially isolates the inside of the unit 2 from the outside, thereby defining a sealed space. A narrow slit 16 extending in a direction parallel to the lamp 3 is provided to the cover member 1, and the slit 16 is covered by a transparent member 10 such as a glass plate fixed onto the cover member 1. The transparent member 10 may be located in the slit 16. The lamp 3 is arranged on the cover member 1. That is, the lamp 3 is positioned in an external space isolated from the unit 2 comprising the reduction optical system and the CCD image sensor 11 by the cover member 1 and the transparent member 10.

The lamp 3 is positioned in close proximity to the document 17 on the document setting glass plate 18 and emits the light 15a toward the document 17. Then, the irradiation light 15a is reflected on a surface to be read of the document 17, and the reflected light 15b passes through the transparent member 10 and the slit 16 and reaches the mirror 13 in the reduction optical system through a slit 4' formed in the frame member 4 or a transparent plate disposed thereon or therein. Then, the reflected light 15b is reflected and deflected by the mirror 13, converged by the lens 12, and enters the CCD element row of the CCD image sensor 11. In the CCD image sensor 11, the light 15b is converted into electrical information. The image reading apparatus 20 moves along the scanning direction 21 (direction orthogonal to a direction of the CCD element row) depicted in FIG. 1 by a non-illustrated drive mechanism, whilst the CCD image sensor 11 converts the reflected light 15b from the document 17 into the electrical information as described above, thereby reading image information on the surface to be read of the document 17.

In this embodiment, as shown in FIG. 2, since the unit 2 comprising the reduction optical system and the CCD image sensor 11 is covered with the cover member 1 and the transparent member 10 and isolated from the outside, the dust or grime does not adhere, and deterioration in the read-out image quality does not occur. Additionally, the lamp 3 is arranged at the outside of the space (inner space of the unit 2) in which the reduction optical system and the CCD image sensor 11 are disposed so as to be covered with the cover member 1, and isolated from a sealed space (inner space of the unit 2) where the reduction optical system and the CCD image sensor 11 exist. Therefore, even if the lamp 3 generates heat during lighting, the heat is blocked off by the cover member 1 and it is not transmitted to the sealed space (inner space of the unit 2) where the reduction optical system and the CCD image sensor 11 exist. Thus, a temperature of the reduction optical system and the CCD image sensor 11 is not increased by the lamp 3, and the performance of the apparatus is not degraded due to the heat.

Description will now be given as to an attachment structure for the lamp 3 with reference to FIGS. 3A and 3B. In this embodiment, the lamp 3 has a protrusion 22" at one end (first end) thereof and a through hole (not shown) at the other end (second end) thereof. The cover member 1 has a lamp positioning plate 22' having a lamp positioning hole 22 at a portion corresponding to the first end of the lamp 3, and a female screw 5' at a portion corresponding to the second end of the lamp 3. The lamp 3 is positioned by a lamp positioning means comprising the lamp positioning hole 22 and the protrusion 22". That is, the protrusion 22" is detachably inserted or fitted into the lamp positioning hole 22, and a male screw 5 is engaged with the female screw 5' through the through hole of the second end of the lamp 3.

In this structure, since the lamp positioning means is provided, the lamp 3 can be held on the cover member 1 with the excellent positional accuracy. Thus, the relative positional relationship between the lamp 3 and the surface to be read of the document 17 (see FIGS. 1 and 2) and the relative positional relationship between the lamp 3 and the slit 16 of the cover member 1 can be accurately maintained, so that the read-out image quality is not degraded. Further, when the lamp 3 is periodically replaced with fresh one, any other member such as the cover member 1 does not have to be removed and such a replacement can be easily carried out. A fresh lamp 3 can be readily positioned and fixed at a predetermined position with the lamp positioning hole 22 being used as a reference.

Figure 4A:
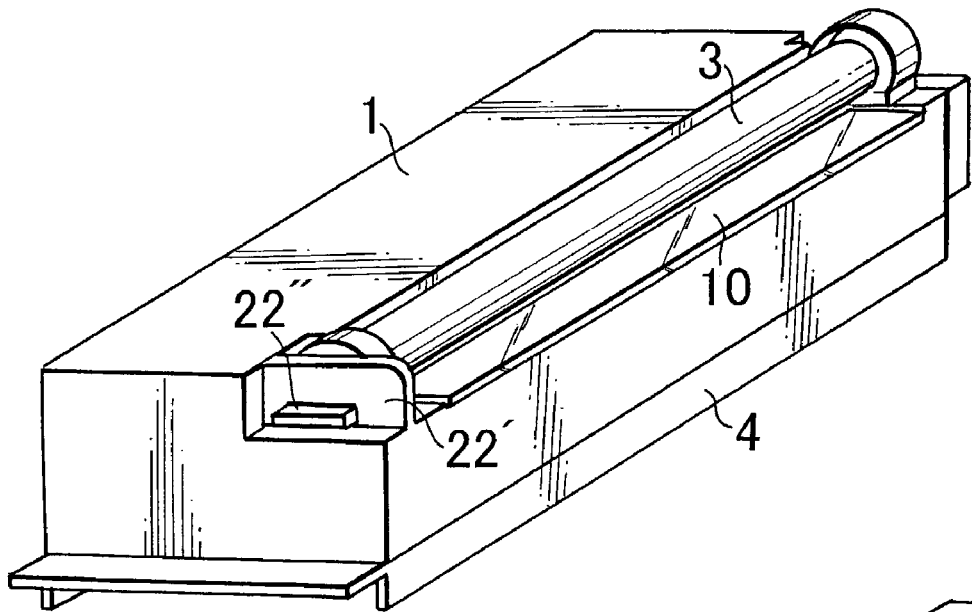
FIG. 4A is a partial perspective view of an embodiment of the image reading apparatus according to the present invention, especially showing an attachment structure for a transparent member.
Figure 4B:
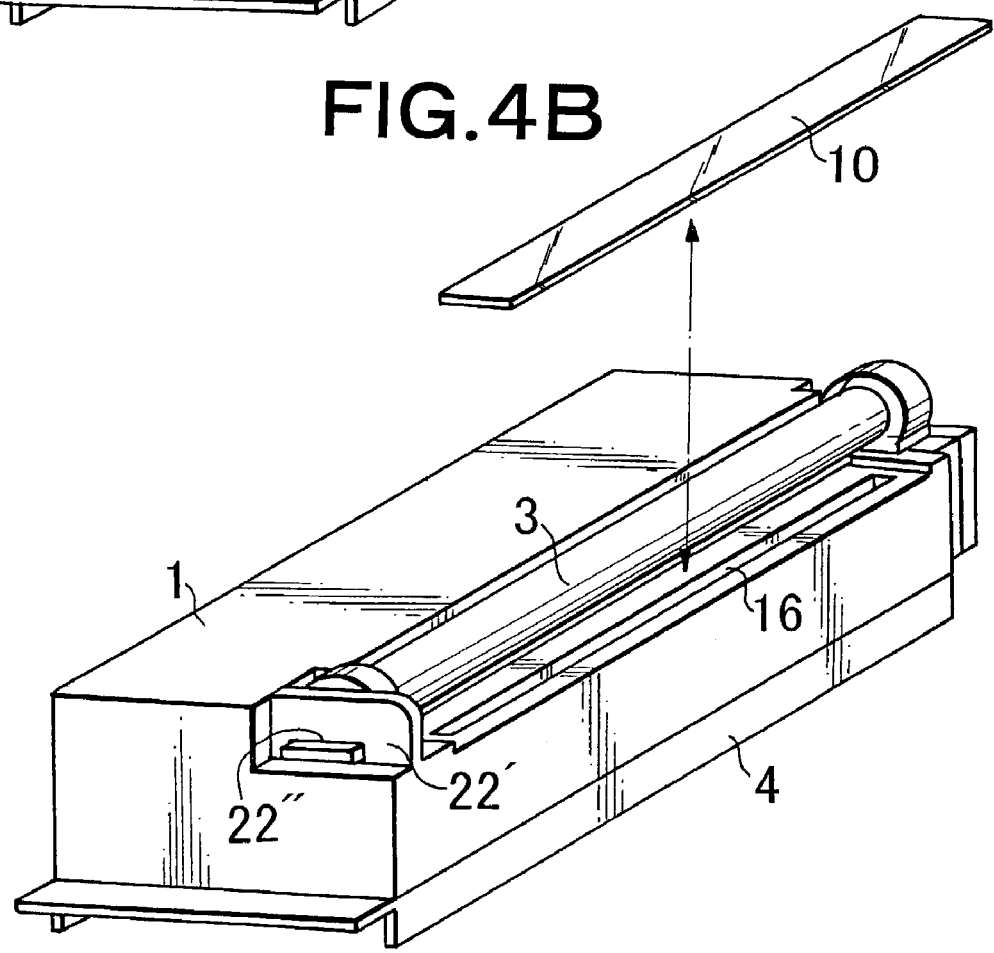
FIG. 4B is an exploded perspective view of the embodiment of FIG. 4A.

Subsequently, the transparent member 10 such as a glass plate is attached to the cover member 1 so as to cover the slit 16 as shown in FIGS. 4A and 4B. When there is adopted a structure that the slit 16 is covered with the transparent member 10 in this manner, the dust or grime can be prevented from entering the inner side of the cover member 1 (and the inner side of the unit 2) through the slit 16, and the stain of the reduction optical system or the CCD image sensor 11 can be further assuredly avoided. Also, the heat from the lamp 3 and the like is hardly transmitted to the reduction optical system or the CCD image sensor 11, thereby further securely avoiding reduction in performance of each component due to the heat. The structure of FIGS. 4A and 4B corresponds to the embodiment depicted in FIG. 2.

Figure 3A:
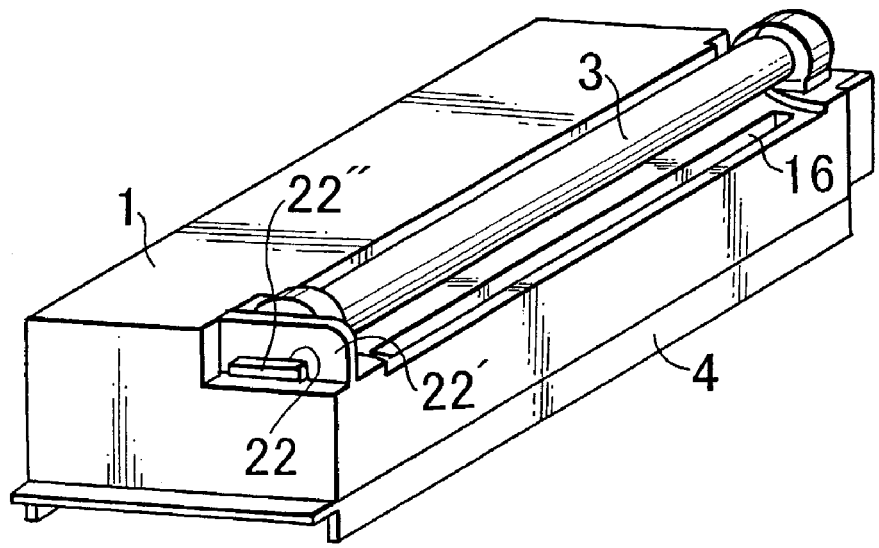
FIG. 3A is a partial perspective view of an embodiment of the image reading apparatus according to the present invention, especially showing an attachment structure for a lamp.
Figure 3B:
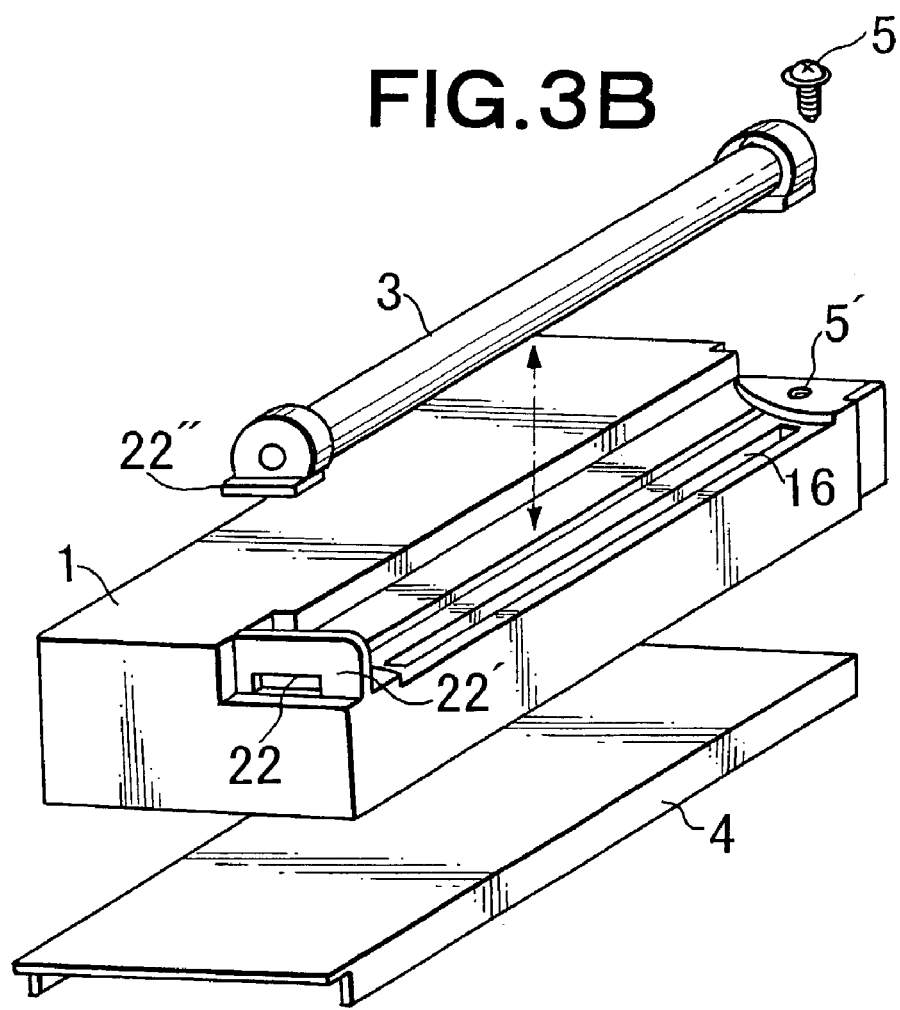
FIG. 3B is an exploded perspective view of the embodiment of FIG. 3A.
Figure 5A:
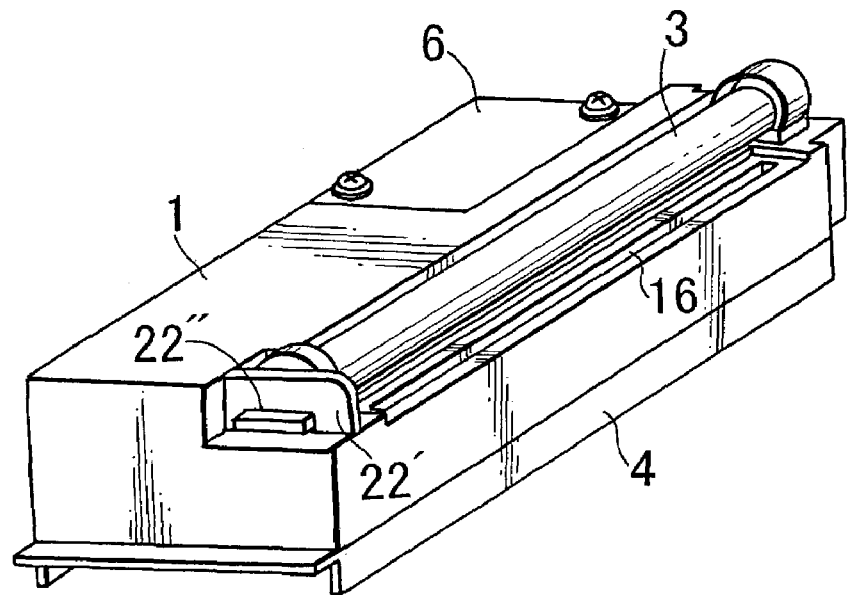
FIG. 5A is a partial perspective view of an embodiment of the image reading apparatus according to the present invention, especially showing an attachment structure for a lighting circuit for the lamp.
Figure 5B:
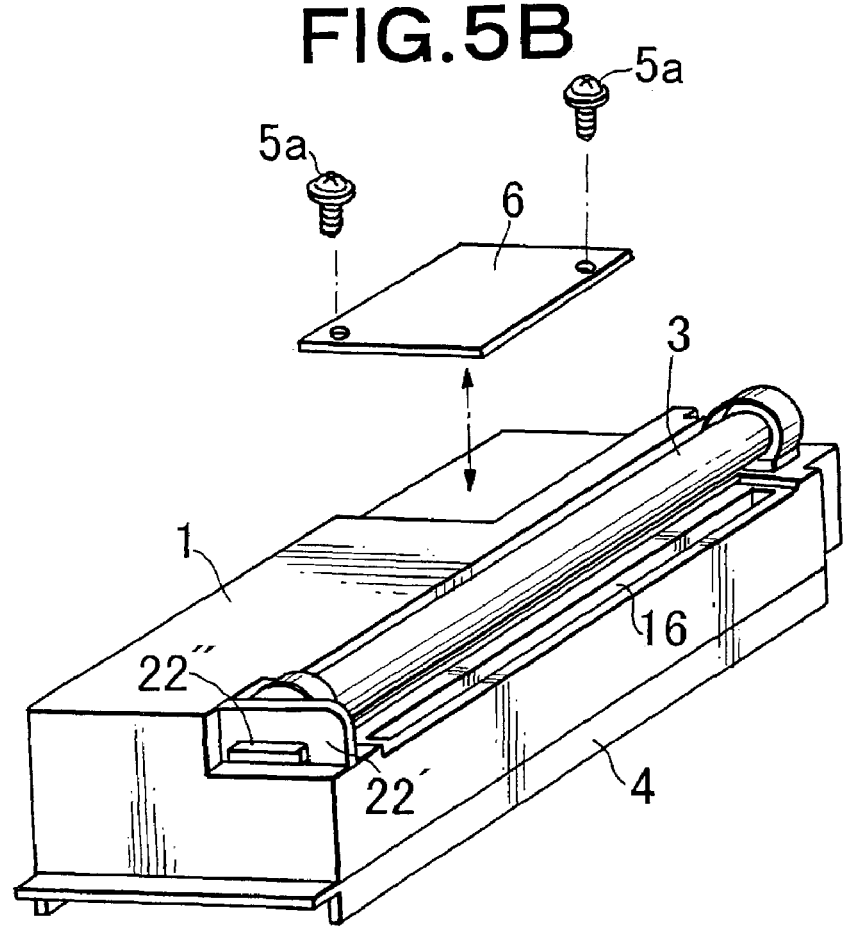
FIG. 5B is an exploded perspective view of the embodiment of FIG. 5A.

In the structure illustrated in FIGS. 5A and 5B, in addition to the structure depicted in FIGS. 3A and 3B, an inverter circuit 6 which is a lighting circuit for the lamp 3 is attached onto the cover member 1 by screws 5a in the same manner as the case of the lamp 3. That is, like the lamp 3, the inverter circuit 6 is isolated by the cover member 1 from the sealed space (inner space of the unit 2) where the reduction optical system and the CCD image sensor 11 exist. Therefore, even if the inverter circuit 6 generates the heat when driving the lamp 3, the heat is blocked off by the cover member 1 and it is not transmitted to the sealed space (inner space of the unit 2) where the reduction optical system and the CCD image sensor 11 exist, and hence a temperature of the reduction optical system, the CCD image sensor 11 or the like is not increased, thereby avoiding a reduction in performance.

Figure 6A:
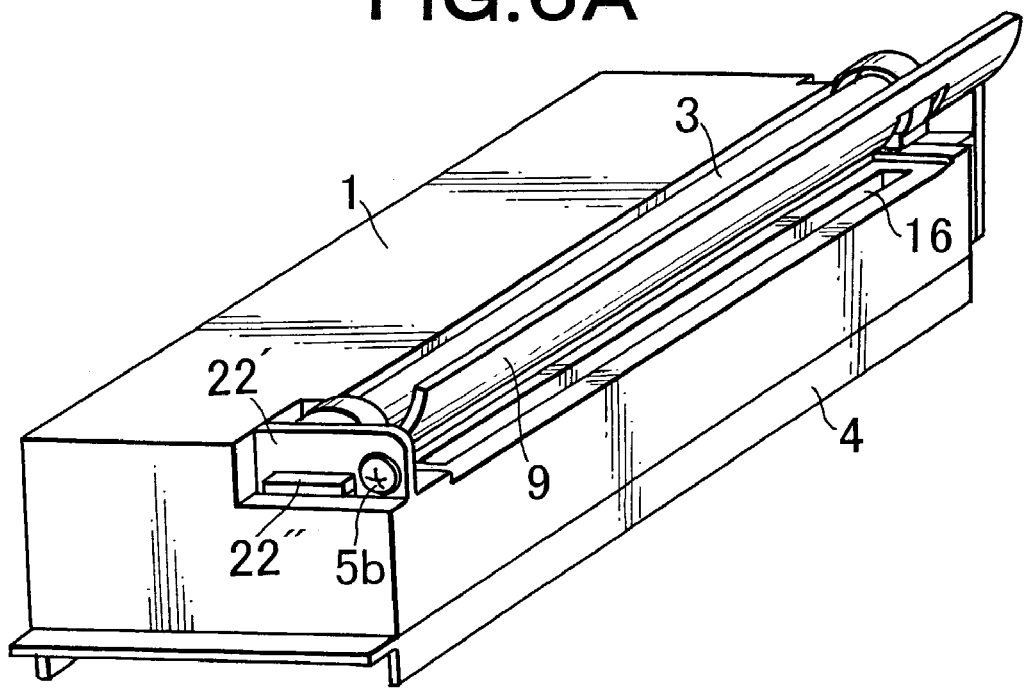
FIG. 6A is a partial perspective view of an embodiment of the image reading apparatus according to the present invention, especially showing an attachment structure for a reflecting plate.
Figure 6B:
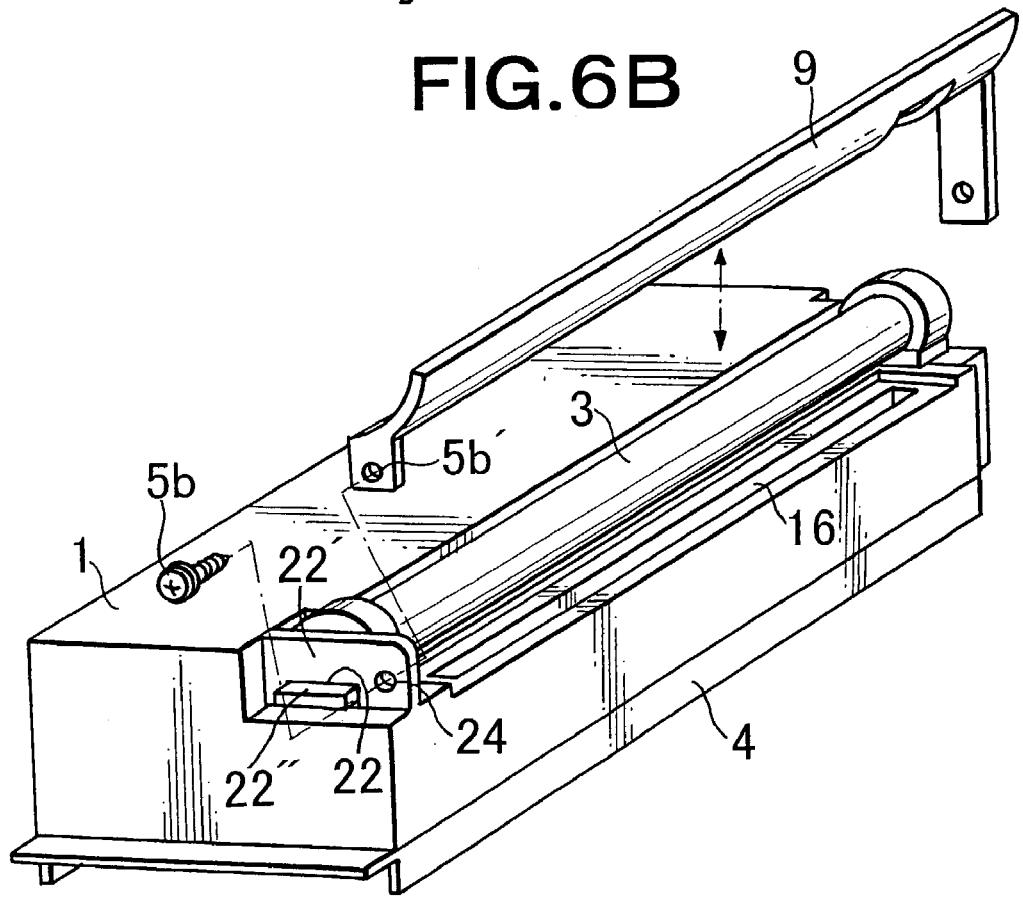
FIG. 6B is an exploded perspective view of the embodiment of FIG. 6A.

In the structure shown in FIGS. 6A and 6B, there is further provided a reflecting plate 9 which condenses the light 15a emitted from the lamp 3 (see FIG. 2) onto the surface to be read of the document 17 (see FIGS. 1 and 2). Specifically, a reflecting plate positioning hole 24 is provided on the lamp positioning plate 22' of the cover member 1 in the vicinity of the lamp positioning hole 22, and the reflecting plate 9 is positioned by a reflecting plate positioning means comprising the reflecting plate positioning hole 24, a male screw 5b and a female screw 5b' formed on one end of the reflecting plate 9. That is, the reflecting plate 9 is attached to the lamp positioning plate 22' by the screw 5b. The other end of the reflecting plate 9 is attached to the cover member 1 by a screw (not shown).

According to this structure, a quantity of the irradiation light 15a condensed onto the surface to be read of the document 17 can be increased as compared with the case where the reflecting plate 9 does not exist, the condensing efficiency can be improved, thereby efficiently utilizing the light emitted from the lamp 3. As a result, a necessary quantity of light emission can be reduced, and hence the power consumption of the lamp 3 can be suppressed, thus realizing both minimization of a power supply circuit and energy saving. Since the reflecting plate positioning means is provided, the reflecting plate 9 has the excellent relative positional accuracy relative to both the lamp 3 and the surface to be read of the document 17, thereby assuring the high condensing efficiency.

Figure 7A:
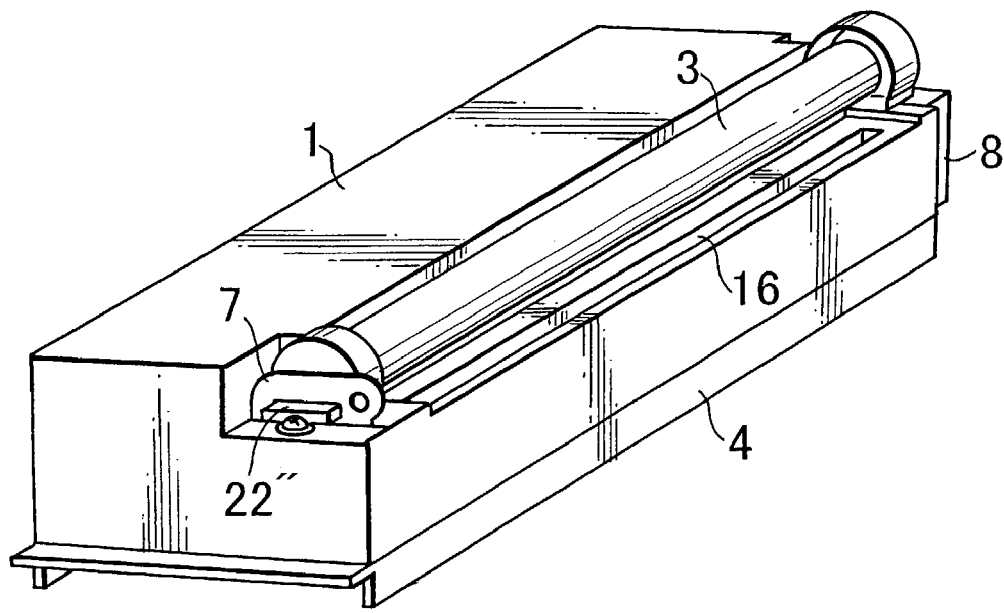
FIG. 7A is a partial perspective view of an embodiment of the image reading apparatus according to the present invention, especially showing an attachment structure for a lamp and a cover member.
Figure 7B:
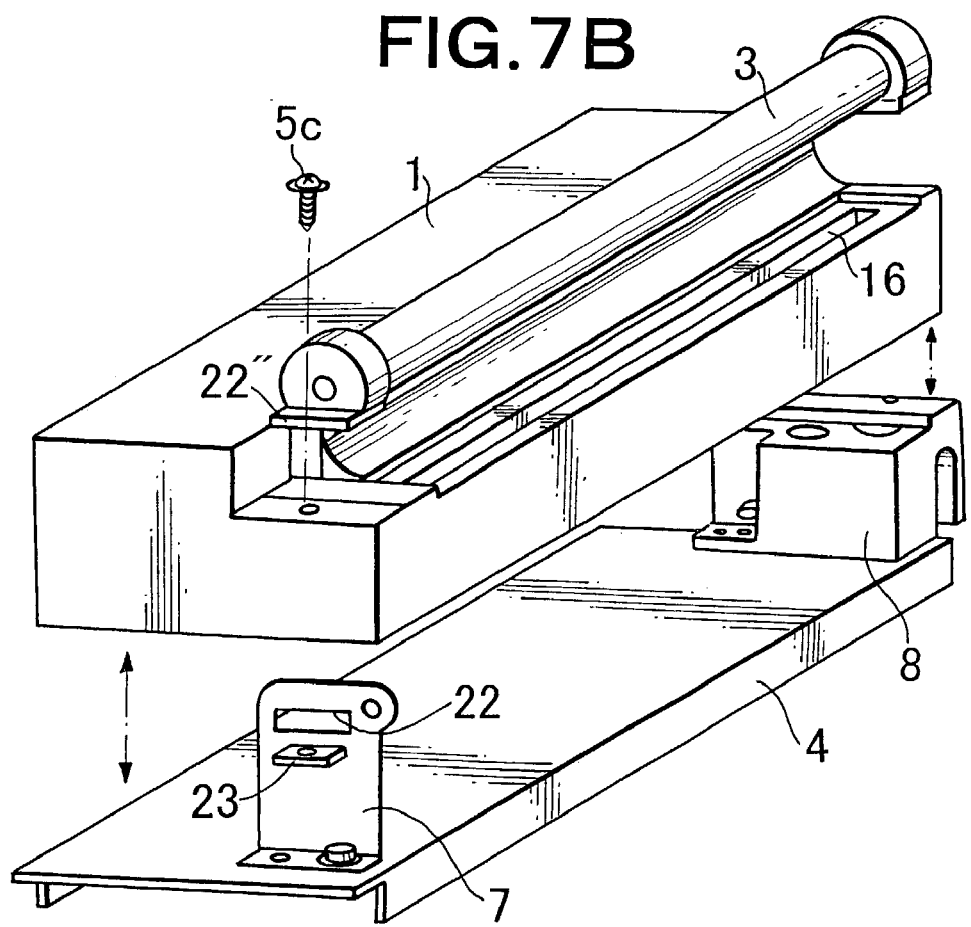
FIG. 7B is an exploded perspective view of the embodiment of FIG. 7A.

In the structure shown in FIGS. 7A and 7B, a member which holds the lamp 3 is attached to the frame member 4. That is, a holding member 7 and a holding member 8 are attached to the upper surface of the frame member 4, and the lamp positioning hole 22 and a cover member positioning member 23 having a female screw are provided to the holding member 7 in close proximity to each other. The cover member 1 is positioned by a cover member positioning means comprising the cover member positioning member 23 and a male screw 5c, where the male screw 5c is engaged with the female screw of the cover member positioning member 24 through a through hole formed in the cover member 1 at one end portion thereof. The other end portion of the cover member 1 is attached to the holding member 8 in analogous manner. The lamp 3 is positioned by the lamp positioning means where the protrusion 22" is fitted to the lamp positioning hole 22 formed on the holding member 7 extending vertically through a slit-shaped opening formed in the cover member 1. Thus, both the lamp 3 and the cover member 1 are attached to the holding members 7 and 8 by the screw 5c and the like.

According to this structure, since the lamp 3 and the cover member 1 are positioned relative to the same member (frame member 4), the relative positional accuracy of both members, especially the relative positional accuracy of the slit 16 provided to the cover member 1 and the lamp 3 is excellent, and the relative positional relationship between these members and the surface to be read of the document 17 (see FIGS. 1 and 2) is also good. Typically, since the width of the slit 16 is narrowed to the necessary minimum level in order to prevent unnecessary light from entering from the outside as much as possible, it is very effective to accurately maintain the relative positional relationship between the slit 16, the lamp 3 and the document 17 by the holding members 7 and 8, the lamp positioning means and the cover member positioning means in order to assure passage of the reflected light 15b through the slit 16.

Figure 8A:
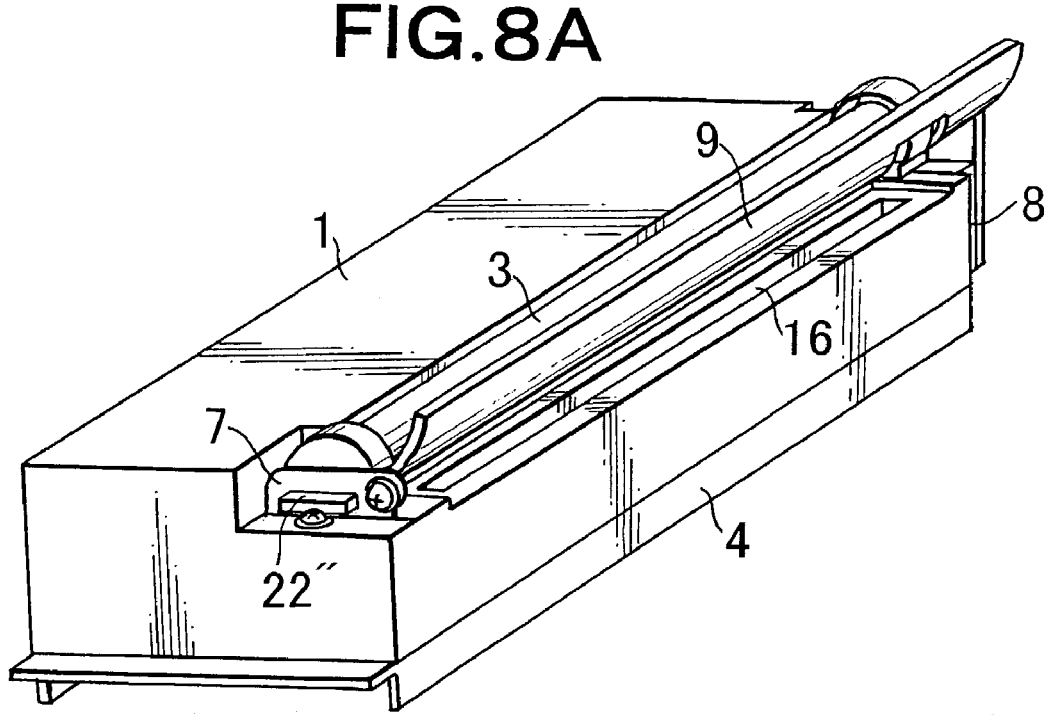
FIG. 8A is a partial perspective view of an embodiment of the image reading apparatus according to the present invention, especially showing an attachment structure for a reflecting plate.
Figure 8B:
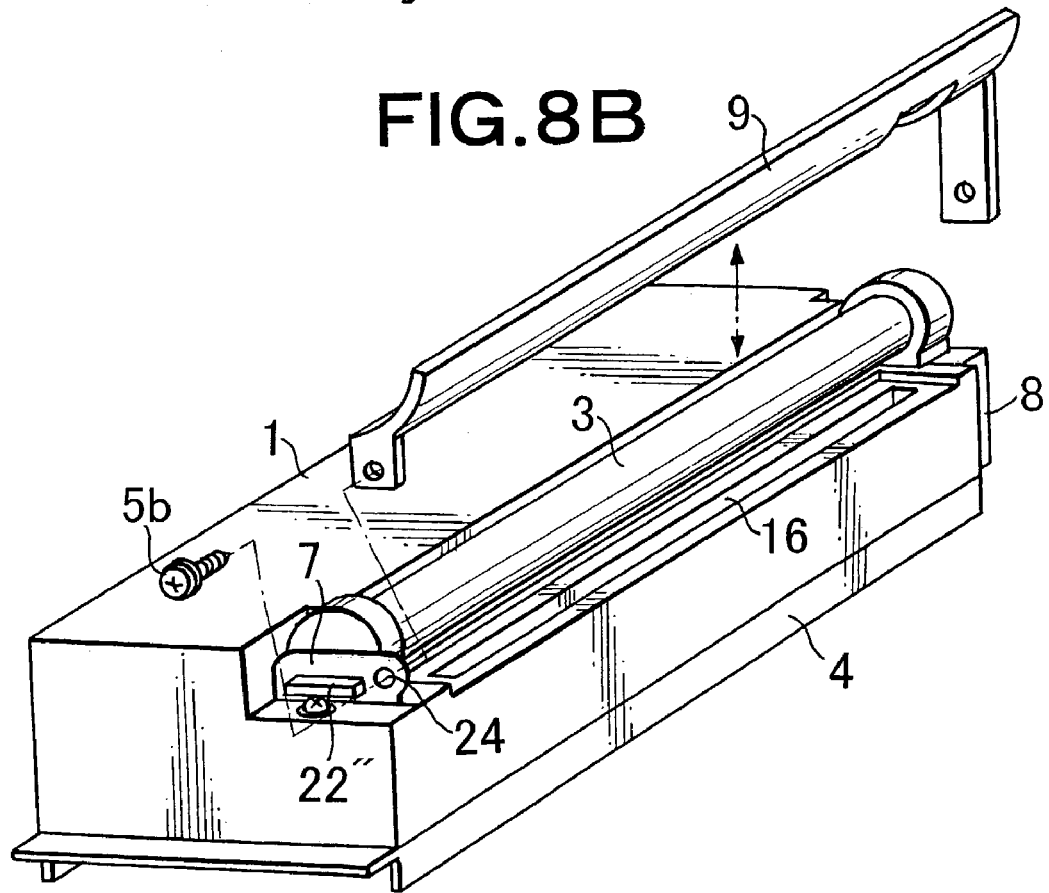
FIG. 8B is an exploded perspective view of the embodiment of FIG. 8A.

In the structure shown in FIGS. 8A and 8B, in addition to the structure depicted in FIGS. 7A and 7B, a reflecting plate 9 which is the same as one in the structure illustrated in FIGS. 6A and 6B is added. That is, a reflecting plate positioning hole 24 is provided to the holding member 7, and the reflecting plate 9 is positioned by the reflecting plate positioning means comprising the reflecting plate positioning hole 24 and accurately attached to the holding members 7 and 8 by the screw 5b and the like, thereby obtaining the excellent relative positional accuracy with respect to the lamp 3 and the surface to be read of the document 17 (see FIGS. 1 and 2).

It is to be noted that FIGS. 5A to 8B show the state that the transparent member 10 is omitted and the slit 16 is exposed for the convenience's sake. Although the transparent member 10 may not be provided and the slit 16 may be exposed in this manner, the structure in which the slit 16 is covered with the transparent member 10 such as a glass plate like the structure depicted in FIGS. 4A and 4B can improve the sealing property of the inner space of the unit 2, and the dust, grime or the heat from the lamp 3 or the like is hardly to be transmitted to the reduction optical system or the CCD image sensor 11, thereby further assuredly preventing a reduction in performance of each component.

As shown in FIG. 1, the embodiment mentioned above adopts the image input portion 19 which is of a type that the document is kept in the stationary state and the image reading apparatus 20 is scanned. Contrarily, the present invention can be likewise applied to the image input portion which is of a type that the image reading apparatus 20 is maintained in the stationary state and the document 17 is moved. Furthermore, the present invention can be applied to any apparatus which has the image input portion 19 such as a facsimile or a scanner as well as the copying machine 25.

Although the screw 5, 5a, 5b or 5c is used to attach the lamp 3, the inverter circuit 6, the reflecting plate 9 or the like in the foregoing embodiment, it is possible to employ an easy fixing method such as snap fitting without using the screw.

In the present invention, since the optical system which leads the reflected light from the surface to be read of the object and the image sensor onto which the reflected light is incident are covered with the cover member, the dust or grime can be prevented from adhering to the mirror or the lens constituting the optical system and the image sensor, and the excellent read-out image quality can be obtained for a relatively long time without requiring cleaning, thereby eliminating the labor and the cost for the maintenance operation.

Moreover, the light source or its lighting circuit is arranged outside the cover member and they are isolated by the cover member from the space accommodating the image sensor or the optical system, thereby suppressing transmission of the heat from the light source or the like to the space. As a result, a reduction in performance or degradation of each component due to an increase in temperature can be avoided, and the excellent read-out image quality can be obtained constantly. In addition, when periodically replacing the light source, such a replacement can be readily performed without removing the cover member, and hence the labor and the cost for the maintenance operation can be eliminated.

When there is adopted the structure that the slit provided to the cover member in order to transmit the light therethrough is covered with the transparent member such as a glass plate, the sealing property of the space accommodating the image sensor or the optical system can be improved, and adherence of the dust or grime and transmission of the heat to the image sensor or the optical system can be further assuredly avoided. When the transparent member is directly attached to the cover member, the high positional accuracy can be readily assured, and the image reading apparatus having the equivalent performance can be readily manufactured repeatedly.

When the reflecting plate which reflects the irradiation light from the light source is included, a quantity of light with which the surface to be read of the object is irradiated can be increased, thereby efficiently utilizing the irradiation light. Consequently, the power consumption of the light source can be suppressed, thus realizing minimization of the power supply circuit and energy saving.

When the positioning means for the light source, the cover member and the reflecting plate are respectively provided, their relative positional accuracies can be improved. Therefore, irregularities in performance between apparatuses can be suppressed even if the apparatuses are produced in large quantities, a quantity of irradiation light on the object and a quantity of reflected light by the object according to design values can be obtained without irregularities, thereby readily repeatedly producing the apparatus having the high read-out image quality performance. In addition, when the light source is replaced, the high relative positional accuracy can be maintained. A reduction or irregularities in positional accuracy due to an assembling error or aging hardly occurs.

What is claimed is:

1. An image reading apparatus comprising:
   a light source emitting a light for irradiation of a surface of an object;
   an image reading unit containing an image sensor and an optical system which causes the light reflected by the surface of the object to enter the image sensor;

a cover member covering the unit so as to allow the light reflected by the surface of the object to pass therethrough toward the optical system, wherein the light source is positioned so that the cover member spatially isolates the light source from an inner space of the image reading unit, the image reading apparatus further comprising two sealed spaces, one of the two sealed spaces being an inner space of the image reading unit, and the other of the two sealed spaces being defined by the cover member and the image reading unit.

2. The image reading apparatus according to claim 1, wherein the optical system comprises a mirror and a lens.

3. The image reading apparatus according to claim 1, wherein the cover member has a slit through which the light reflected by the surface of the object is transmitted.

4. The image reading apparatus according to claim 3, further comprising a transparent member attached to the cover member so as to seal the slit.

5. The image reading apparatus according to claim 1, further comprising a lighting circuit for the light source attached to the cover member so that the cover member spatially isolates the lighting circuit from the inner space of the image reading unit.

6. The image reading apparatus according to claim 1, wherein the light source is attached to the cover member.

7. The image reading apparatus according to claim 1, further comprising a reflecting plate attached to the cover member, which condenses the light emitted from the light source onto the surface of the object; and reflecting plate positioning means for defining a relative positional relationship between the cover member and the reflecting plate.

8. The image reading apparatus according to claim 1, wherein the image reading unit has a frame for accommodating the image sensor and the optical system, and the cover member is attached to the frame.

9. The image reading apparatus according to claim 8, further comprising a holding member for the light source, which is attached to the frame and extending through the cover member to the outside of the cover member in which the light source is positioned; light source positioning means for defining a relative positional relationship between the light source and the frame; and cover member positioning means for defining a relative positional relationship between the cover member and the frame.

10. The image reading apparatus according to claim 9, further comprising a reflecting plate attached to the holding member, which condenses the light emitted from the light source onto the surface of the object; and reflecting plate positioning means for defining a relative positional relationship between the holding member and the reflecting plate.

* * * * *